US012114488B2

United States Patent
Yang et al.

(10) Patent No.: US 12,114,488 B2
(45) Date of Patent: Oct. 8, 2024

(54) ENHANCING GAPFILL PERFORMANCE OF DRAM WORD LINE

(71) Applicant: Applied Materials, Inc., Santa Clara, CA (US)

(72) Inventors: Yong Yang, Tengzhou (CN); Kunal Bhatnagar, Chandler, AZ (US); Srinivas Gandikota, Santa Clara, CA (US); Seshadri Ganguli, Sunnyvale, CA (US); Jose Alexandro Romero, Scottsdale, AZ (US); Mandyam Sriram, San Jose, CA (US); Mohith Verghese, Phoenix, AZ (US); Jacqueline S. Wrench, San Jose, CA (US); Yixiong Yang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 107 days.

(21) Appl. No.: 17/308,577

(22) Filed: May 5, 2021

(65) Prior Publication Data
US 2022/0359532 A1   Nov. 10, 2022

(51) Int. Cl.
*H10B 12/00* (2023.01)
*C23C 16/42* (2006.01)
*C23C 16/455* (2006.01)

(52) U.S. Cl.
CPC .......... *H10B 12/488* (2023.02); *C23C 16/42* (2013.01); *C23C 16/45527* (2013.01); *C23C 16/45553* (2013.01)

(58) Field of Classification Search
CPC ............... H01L 27/10891; C23C 16/42; C23C 16/45527; C23C 16/45553
See application file for complete search history.

(56) References Cited

U.S. PATENT DOCUMENTS

| 5,429,973 A * | 7/1995 | Hong ................... H10B 20/383 438/270 |
| 7,723,755 B2 * | 5/2010 | Lee ................... H01L 27/10891 257/211 |
| 8,309,448 B2 | 11/2012 | Hwang et al. |

(Continued)

FOREIGN PATENT DOCUMENTS

WO   WO-2021035236 A1 *   2/2021   ............. C23C 16/06

OTHER PUBLICATIONS

PCT International Search Report and Written Opinion in PCT/US2022/027590 dated Aug. 22, 2022, 9 pages.

*Primary Examiner* — Michael G Miller

(74) *Attorney, Agent, or Firm* — Servilla Whitney LLC

(57) ABSTRACT

Methods of forming memory devices are described. A molybdenum silicide nucleation layer is formed, and the substrate is soaked in a titanium precursor prior to a bulk molybdenum gap fill process. In other embodiments, a molybdenum silicide film is formed in a first process cycle and a second process cycle is performed where the substrate is exposed to a titanium precursor. In further embodiments, a substrate having at least one feature thereon is exposed to a first titanium precursor and a nitrogen-containing reactant. The substrate is then soaked in a second titanium precursor, and then is exposed to a first molybdenum precursor followed by exposure to a silane to form a molybdenum silicide layer on a surface of the substrate.

13 Claims, 6 Drawing Sheets

(56) References Cited

U.S. PATENT DOCUMENTS

| | | |
|---|---|---|
| 2003/0045068 A1 | 3/2003 | Gutsche et al. |
| 2007/0020923 A1* | 1/2007 | Kraus ............... H01L 21/28562 |
| | | 257/E21.171 |
| 2007/0045854 A1* | 3/2007 | Lim ................. H01L 21/76846 |
| | | 257/763 |
| 2016/0322229 A1 | 11/2016 | Ganguli et al. |
| 2017/0350013 A1 | 12/2017 | Chan et al. |
| 2018/0053660 A1* | 2/2018 | Jandl ................ H01L 21/28562 |

\* cited by examiner

ENHANCING GAPFILL PERFORMANCE OF DRAM WORD LINE

TECHNICAL FIELD

Embodiments of the present invention pertain to the field of semiconductor devices and semiconductor device manufacturing. In particular, embodiments pertain to methods used for dynamic random access memory (DRAM) word line processes.

BACKGROUND

Electronic devices, such as personal computers, workstations, computer servers, mainframes, and other computer related equipment such as printers, scanners and hard disk drives use memory devices that provide substantial data storage capability, while incurring low power consumption. There are two major types of random-access memory cells, dynamic and static, which are well-suite for use in electronic devices. Dynamic random-access memories (DRAMs) can be programmed to store a voltage which represents one of two binary values but require periodic reprogramming or "refreshing" to maintain this voltage for more than very short periods of time. Static random-access memories (SRAM) are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and to increase memory cell density to allow more memory to be squeezed onto a single memory chip, especially for densities greater than 256 Megabits. Limitations on cell size reduction include the passage of both active and passive word lines through the cell, the size of the cell capacitor, and the compatibility of array devices with non-array devices.

In manufacturing, DRAM word lines often need to be able to endure severe thermal conditions which are necessary for later processing steps of the circuits. Due to the poor adhesion between metal and trench structures, however, voiding and delamination of the metal fill is often observed during high-temperature post anneal treatment.

Therefore, there is a need for gap fill methods of forming low resistance buried word lines in DRAM cells able to withstand further processing conditions without delamination. Accordingly, there is a need for methods of manufacturing DRAM devices to improve metal gap fill performance.

SUMMARY

One or more embodiments of the disclosure are directed to methods of forming a film. In one embodiment, the method comprises: forming a molybdenum-silicide film in a process cycle comprising sequential exposure of a substrate to a molybdenum precursor, purge gas, a silane precursor, and purge gas, the substrate having at least one feature thereon; and soaking the substrate in a titanium precursor, wherein the substrate is soaked prior to the process cycle or wherein the substrate is soaked after the process cycle.

Other embodiments of the disclosure are directed to methods of forming a film. In one or more embodiments, the method comprises: forming a molybdenum-silicide film in a first process cycle comprising sequential exposure of a substrate to a molybdenum precursor, purge gas, a silane reactant, and purge gas, the substrate having at least one feature thereon; and performing a second processing cycle comprising exposing the substrate to a titanium precursor and ammonia.

Further embodiments of the disclosure are directed to method of forming a film. In one or more embodiments, the method comprises: exposing a substrate having at least on feature thereon to a first titanium precursor and ammonia; soaking the substrate in a second titanium precursor; exposing the substrate to a first molybdenum precursor; and exposing the substrate to a silane to form a molybdenum silicide layer on a surface of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
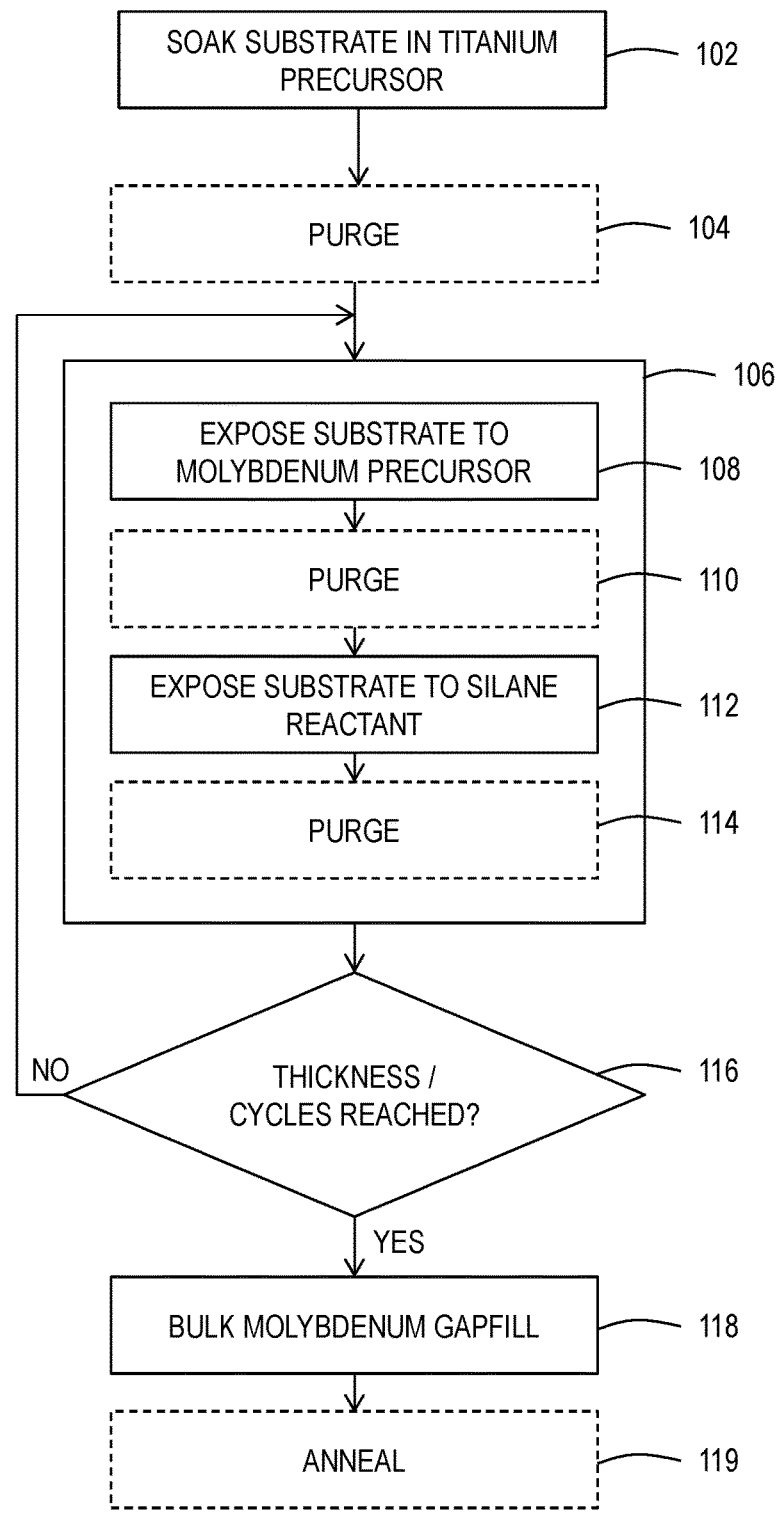
FIG. 1 illustrates a process flow diagram of a method according to one or more embodiments.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g., aluminum precursor) is pulsed into the reaction zone followed by a first time delay. Next, a second precursor or compound B (e.g., oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

As used herein throughout the specification, "substantially simultaneously" means that most of the duration of the first reactive compound exposure overlaps with the second reactive compound exposure.

As used herein, the term "purging" includes any suitable purge process that removes unreacted precursor, reaction products and by-products from the process region. The suitable purge process includes moving the substrate through a gas curtain to a portion or sector of the processing region that contains none or substantially none of the reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the purging the substrate surface or the reaction chamber may occur for a time duration in a range of from 0.2 seconds to 30 seconds, from 0.2 seconds to 10 seconds, from 0.2 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor. The DRAM device is formed of an array of DRAM cells. The rows on access transistors are linked by word lines, and the transistor inputs/outputs are linked by bit lines. Historically, DRAM capacitors have evolved from planar polysilicon-oxide-substrate plate capacitors to 3-D structures which have diverged into "stack" capacitors with both plates above the substrate, and "trench" capacitors using an etched cavity in the substrate as the common plate.

Current DRAM buried word line (bWL) processes involve titanium nitride (TiN) and tungsten (W) stacks. With further scaling of the bWL dimensions, one focus is removing the titanium nitride barrier from the stacks to form barrierless metal fills in trench structures. Due to the poor adhesion between metal and trench structures, however, voiding and delamination of the metal fill is often observed during high-temperature post anneal treatments. Such voids and delamination are undesired because it will cause problems for subsequent planarization or etching processes. Voids and delamination also contribute to an increase in stack resistance. Accordingly, embodiments of the present disclosure relate to enhancing gap fill performance of DRAM buried word line (BWL) so as to advantageously maintain good line bending performance (i.e., line bending less than 2 nm), reduce interface roughness, and lower film resistivity.

Traditionally, DRAM cells have recessed high workfunction metal structures in buried word line structure. In a DRAM device, a bit line is formed in a metal level situated above the substrate, while the word line is formed at the polysilicon gate level at the surface of the substrate. In a buried word line (bWL) device, a word line is buried below the surface of a semiconductor substrate using a metal as a gate electrode.

The selection of metal to be used as a gate electrode can greatly impact the performance of the device. Without intending to be bound by theory, it is believed that the use of low melting point metals with low resistance advantageously provides bWL DRAM with reduced resistance. When exposed to the thermal process requirements used in manufacturing bWL DRAM, however, these materials are often found to delaminate from the surface. The delamination can impact final array resistance and cause reliability issues.

Some embodiments of this disclosure advantageously form memory devices with high quality gap fill with good line bending performance (i.e., line bending less than 2 nm), reduced interface roughness, and lower film resistivity. In some embodiments, the buried word line has a resistivity of 45 µΩ-cm@50 Å.

FIGS. 1 through 5 illustrate process flow diagrams of methods according to one or more embodiments of the present disclosure.

With reference to FIG. 1, one or more embodiments of the disclosure are directed to method 100 of depositing a film. The method illustrated in FIG. 1 is representative of an atomic layer deposition (ALD) process in which the substrate or substrate surface is exposed sequentially to the reactive gases in a manner that prevents or minimizes gas phase reactions of the reactive gases. In some embodiments, the method comprises a chemical vapor deposition (CVD) process in which the reactive gases are mixed in the processing chamber to allow gas phase reactions of the reactive gases and deposition of the thin film.

In one or more embodiments, the method 100 at operation 102 includes soaking the substrate in a solution of a titanium precursor. In some embodiments, the titanium precursor may comprise a titanium halide selected from one or more of titanium chloride ($TiCl_4$), titanium fluoride ($TiF_4$), titanium iodide ($TiI_4$), and titanium bromide ($TiBr_4$). In some embodiments, the substrate may be soaked in the titanium precursor for a time period in a range of from greater than 0 seconds to 60 seconds. In some embodiments, the substrate may be soaked in the titanium precursor at a pressure in a range of from 3 Torr to 50 Torr and at a temperature in a range of from 300° C. to 600° C. or from 400° C. to 550° C.

At operation 104, the substrate surface or the processing chamber may be optionally purged of the titanium chloride.

As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the molybdenum precursor by any suitable technique including, but not limited to, moving the substrate through a gas curtain to a portion or sector of the processing chamber that contains none or substantially none of the molybdenum precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N_2$), helium (He), and argon (Ar).

At deposition 106, a process is performed to deposit a molybdenum-containing film on the substrate (or substrate surface). The deposition process can include one or more operations to form a film on the substrate. In operation 108, the substrate (or substrate surface) is exposed to a molybdenum precursor, e.g., molybdenum dichloride dioxide ($MoO_2Cl_2$), to deposit a film on the substrate (or substrate surface). The molybdenum precursor can be any suitable molybdenum-containing compound that can react with (i.e., adsorb or chemisorb onto) the substrate surface to leave a molybdenum-containing species on the substrate surface. In one or more embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), Tetrakis(dimethylamino)molybdenum(IV), and Bis(tert-butylimido)-bis(dimethylamido)molybdenum.

The deposition 106 can occur at any suitable temperature, pressure, and exposure duration known to the skilled artisan. In some embodiments, the substrate (or substrate surface) is exposed to a molybdenum precursor at a pressure in a range of from 10 Torr to 50 Torr and at a temperature in a range of from 400° C. to 550° C.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the molybdenum-containing layer, for example, by polishing, etching, reduction, oxidation, halogenation, hydroxylation, annealing, baking, or the like.

At operation 110, the processing chamber or substrate surface is optionally purged to remove unreacted molybdenum precursor, reaction products and by-products. Purging the processing chamber in operation 110 can be the same process or different process than the purge in operation 104. Purging the processing chamber, portion of the processing chamber, area adjacent the substrate surface, etc., removes unreacted reactant, reaction products and by-products from the area adjacent the substrate surface.

At operation 112, the substrate (or substrate surface) is exposed to a silane reactant to form a molybdenum silicide film on the substrate. In some embodiments, the molybdenum silicide film is a nucleation film. The silane reactant may comprise any suitable silane reactant known to the skilled artisan. In some embodiments, the silane reactant is selected from the group consisting of silane, disilane, trisilane, tetrasilane, higher order silanes, and substituted silanes. The silane reactant can react with the molybdenum-containing species on the substrate surface to form the molybdenum silicide film. Exposure to the reactant at operation 112 can occur at any suitable temperature, pressure, and exposure duration known to the skilled artisan. In some embodiments, the substrate (or substrate surface) is exposed to the silane reactant at a pressure in a range of from 10 Torr to 50 Torr and at a temperature in a range of from 400° C. to 550° C.

At operation 114, the processing chamber is optionally purged after exposure to the reactant. Purging the processing chamber in operation 114 can be the same process or different process than the purge in operation 110. Purging the processing chamber, portion of the processing chamber, area adjacent the substrate surface, etc., removes unreacted silane reactant, reaction products and by-products from the area adjacent the substrate surface.

At decision 116, the thickness of the deposited film, or number of cycles of molybdenum-precursor and silane reactant is considered. If the deposited film has reached a predetermined thickness or a predetermined number of process cycles have been performed, the method 100 moves to the bulk molybdenum gap fill operation 118. If the thickness of the deposited film or the number of process cycles has not reached the predetermined threshold, the method 100 returns to deposition 106 to expose the substrate surface to the molybdenum precursor again in operation 108 and continuing. The bulk molybdenum gap fill operation 118 may comprise any suitable gap fill process known to one of skill in the art. In some embodiments, the gap fill process comprises exposing the substrate to a molybdenum precursor, e.g., molybdenum dichloride dioxide ($MoO_2Cl_2$), and a reactant, e.g., hydrogen ($H_2$), to a form bulk molybdenum film. The molybdenum precursor can be any suitable molybdenum-containing compound. In one or more embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), Tetrakis(dimethylamino)molybdenum (IV), and Bis(tert-butylimido)-bis(dimethylamido) molybdenum. In some embodiments, the substrate (or substrate surface) is exposed to a molybdenum precursor at a pressure in a range of from 10 Torr to 50 Torr and at a temperature in a range of from 400° C. to 550° C.

In some embodiments, the gap fill process of operation 118 may be a bottom-up gap fill. In other embodiments, the gap fill process made be a traditional gap fill process.

In one or more embodiments, after the gap fill process, the substrate is annealed at operation 119. The annealing may comprise any suitable annealing process known to one of skill in the art. In one or more embodiments, annealing is conducted at a temperature in a range of from 600° C. to 1200° C. in an atmosphere of argon (Ar) or hydrogen ($H_2$) gas.

Figure 2:
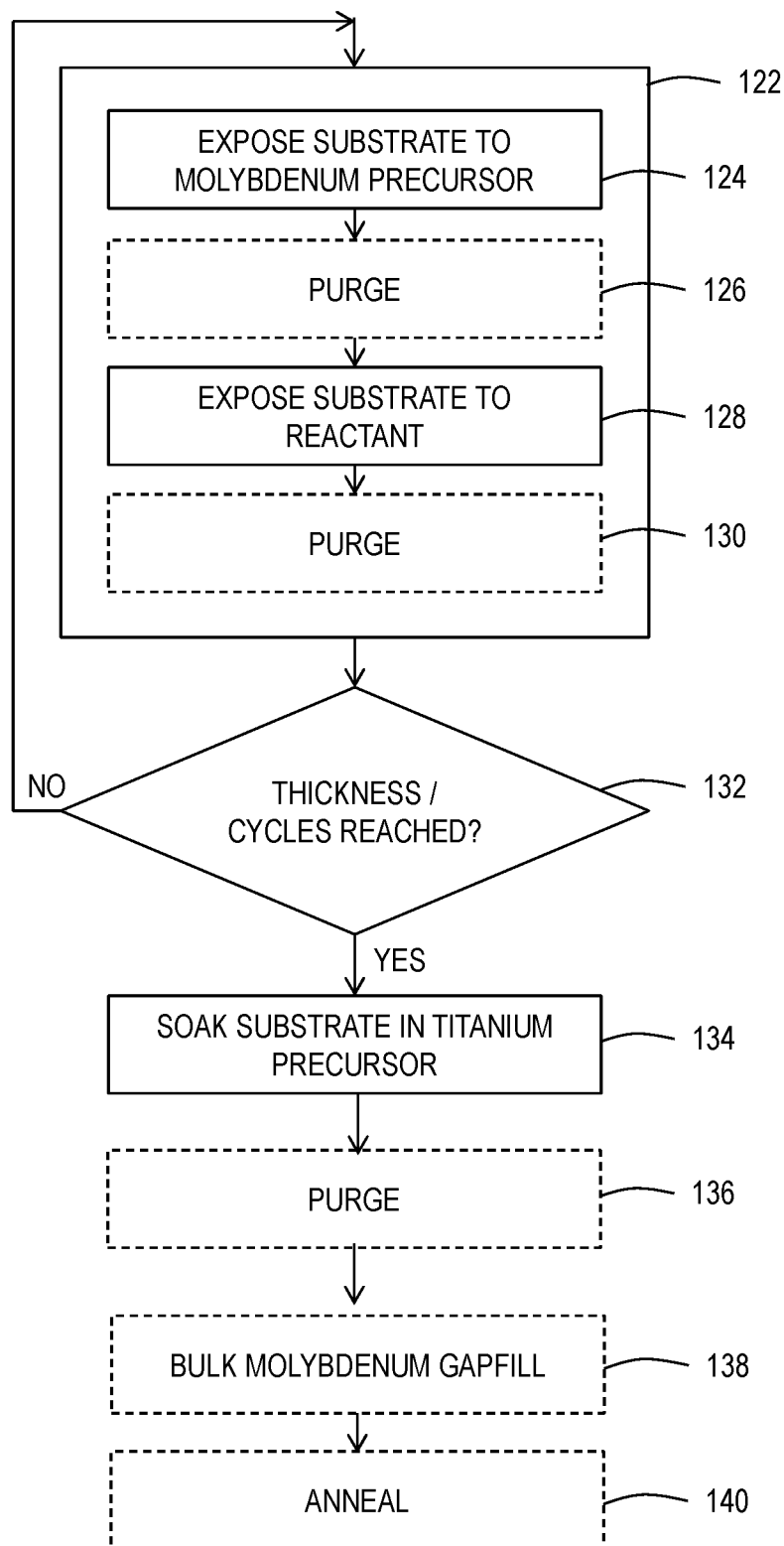
FIG. 2 illustrates a process flow diagram of a method according to one or more embodiments.

With reference to FIG. 2, one or more alternative embodiments of the disclosure are directed to method 120 of depositing a film. The method illustrated in FIG. 2 is also representative of an atomic layer deposition (ALD) process.

The method 120 begins at deposition 122, where a process is performed to deposit a molybdenum-containing film on the substrate (or substrate surface). The deposition process can include one or more operations to form a film on the substrate. In operation 124, the substrate (or substrate surface) is exposed to a molybdenum precursor to deposit a film on the substrate (or substrate surface). The molybdenum precursor can be any suitable molybdenum-containing compound that can react with (i.e., adsorb or chemisorb onto) the substrate surface to leave a molybdenum-containing species on the substrate surface. The molybdenum precursor can be any suitable molybdenum-containing compound that can react with (i.e., adsorb or chemisorb onto) the substrate surface to leave a molybdenum-containing species on the substrate surface. In one or more embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), Tetrakis(dimethylamino)molybdenum(IV), and Bis(tert-butylimido)-bis(dimethylamido)molybdenum. In one or more embodiments, the molybdenum precursor comprises molybdenum dichloride dioxide ($MoO_2Cl_2$).

At operation 126, the processing chamber or substrate surface is optionally purged to remove unreacted molybdenum precursor, reaction products and by-products. Purging the processing chamber in operation 126 can be the same process or different process than the purge described in other embodiments. Purging the processing chamber, portion of the processing chamber, area adjacent the substrate surface, etc., removes unreacted reactant, reaction products and by-products from the area adjacent the substrate surface.

At operation 128, the substrate (or substrate surface) is exposed to a silane reactant to form a molybdenum silicide film on the substrate. In some embodiments, the molybdenum silicide film is a nucleation film. The silane reactant may comprise any suitable silane reactant known to the skilled artisan. In some embodiments, the silane reactant is selected from the group consisting of silane, disilane, trisilane, tetrasilane, higher order silanes, and substituted silanes. The silane reactant can react with the molybdenum-containing species on the substrate surface to form the molybdenum silicide film. Exposure to the reactant at operation 128 can occur at any suitable temperature, pressure, and exposure duration known to the skilled artisan. In some embodiments, the substrate (or substrate surface) is exposed to the silane reactant at a pressure in a range of from 10 Torr to 50 Torr and at a temperature in a range of from 400° C. to 550° C.

At operation 130, the processing chamber is optionally purged after exposure to the reactant. Purging the processing chamber in operation 130 can be the same process or different process than the purge described in other embodiments. Purging the processing chamber, portion of the processing chamber, area adjacent the substrate surface, etc., removes unreacted silane reactant, reaction products and by-products from the area adjacent the substrate surface.

At decision 132, the thickness of the deposited film, or number of cycles of molybdenum-precursor and silane reactant is considered. If the deposited film has reached a predetermined thickness or a predetermined number of process cycles have been performed, the method 120 moves to operation 134. If the thickness of the deposited film or the number of process cycles has not reached the predetermined threshold, the method 120 returns to deposition 122 to expose the substrate surface to the molybdenum precursor again in operation 124 and continuing.

In one or more embodiments, after deposition 122 is completed, the method 120 at operation 134 includes soaking the substrate in a solution of titanium precursor. In some embodiments, the titanium precursor may comprise a titanium halide selected from one or more of titanium chloride ($TiCl_4$), titanium fluoride ($TiF_4$), titanium iodide ($TiI_4$), and titanium bromide ($TiBr_4$). In specific embodiments, the titanium precursor comprises titanium chloride ($TiCl_4$). In some embodiments, the substrate may be soaked in the titanium precursor for a time period in a range of from greater than 0 seconds to 60 seconds. In some embodiments, the substrate may be soaked in the titanium precursor at a pressure in a range of from 3 Torr to 50 Torr and at a temperature in a range of from 300° C. to 500° C.

At operation 136, the substrate surface or the processing chamber may be optionally purged of the titanium precursor. The purging may be the same or different from the purging described in other embodiments.

After soaking the substrate in titanium precursor (operation 134) and optionally purging the substrate surface (operation 136), the method 120 continues with a bulk molybdenum gap fill operation 138. The bulk molybdenum gap fill operation 138 may comprise any suitable gap fill process known to one of skill in the art. In some embodiments, the gap fill process comprises exposing the substrate to a molybdenum precursor and a reactant, e.g., hydrogen ($H_2$), to a form bulk molybdenum film. In some embodiments, the molybdenum precursor may be the same molybdenum precursor used to form the nucleation layer. In other embodiments, the molybdenum precursor is different. The molybdenum precursor can be any suitable molybdenum-containing compound that can react with (i.e., adsorb or chemisorb onto) the substrate surface to leave a molybdenum-containing species on the substrate surface. In one or more embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), Tetrakis(dimethylamino)molybdenum(IV), and Bis(tert-butylimido)-bis(dimethylamido)molybdenum. In some embodiments, the gap fill process of operation 138 may be a bottom-up gap fill. In other embodiments, the gap fill process may be a traditional gap fill process.

In one or more embodiments, after the gap fill process, the substrate is annealed at operation 140. The annealing may comprise any suitable annealing process known to one of skill in the art. In one or more embodiments, annealing is conducted at a temperature in a range of from 600° C. to 1200° C. in an atmosphere of nitrogen ($N_2$), helium (He), argon (Ar), or hydrogen ($H_2$) gas.

Figure 3:
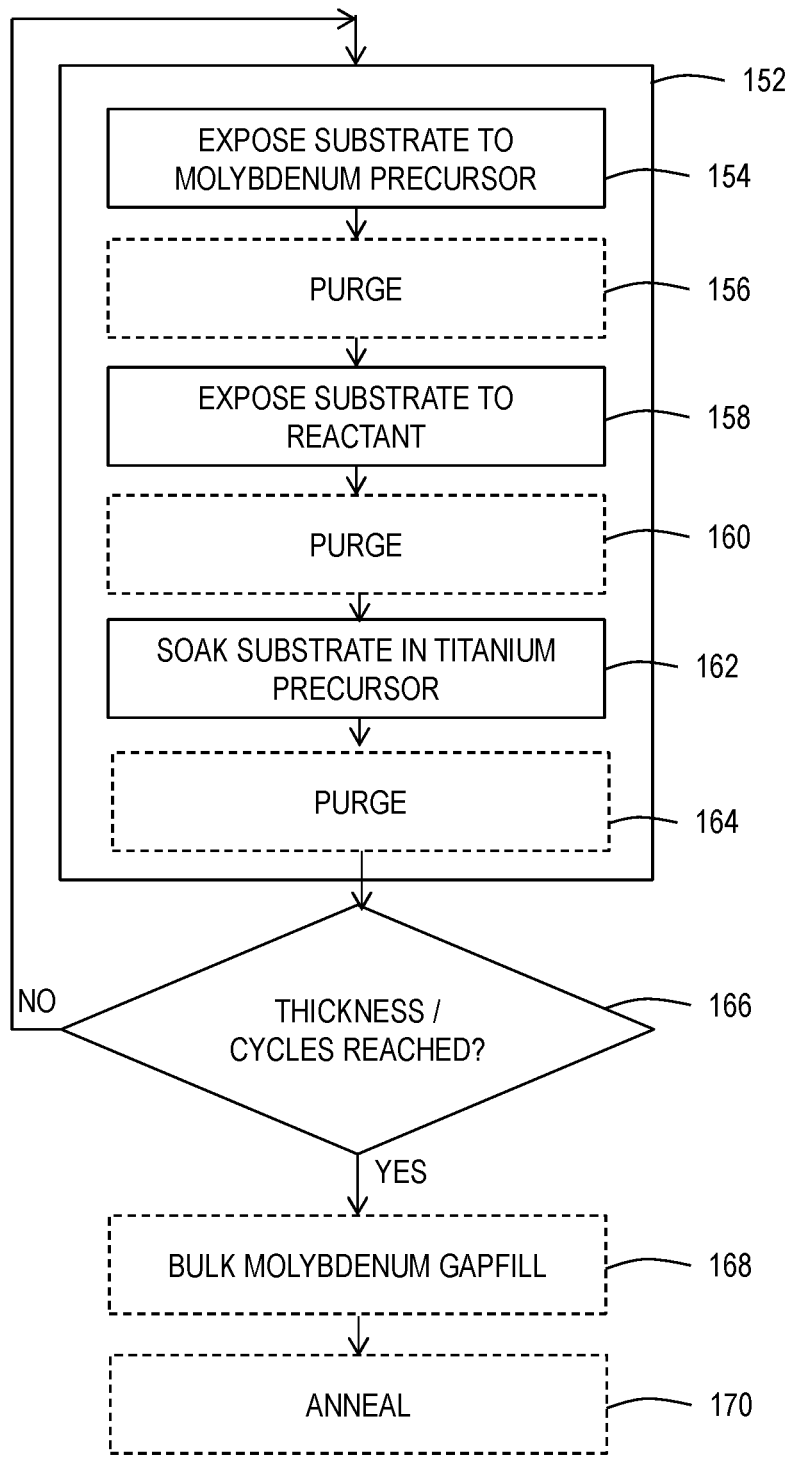
FIG. 3 illustrates a process flow diagram of a method according to one or more embodiments.

With reference to FIG. 3, one or more alternative embodiments of the disclosure are directed to method 150 of depositing a film. The method illustrated in FIG. 3 is also representative of an atomic layer deposition (ALD) process.

The method 150 begins at deposition 152, where a process is performed to deposit a molybdenum-containing film on the substrate (or substrate surface). The deposition process can include one or more operations to form a film on the substrate. In operation 154, the substrate (or substrate surface) is exposed to a molybdenum precursor to deposit a film on the substrate (or substrate surface). The molybdenum precursor can be any suitable molybdenum-containing compound that can react with (i.e., adsorb or chemisorb onto) the substrate surface to leave a molybdenum-containing species on the substrate surface. In one or more embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), tetrakis(dimethylamino)molybdenum (IV), and bis(tert-butylimido)-bis(dimethylamido) molybdenum. In specific embodiments, the molybdenum precursor comprises molybdenum dichloride dioxide ($MoO_2Cl_2$).

At operation 156, the processing chamber or substrate surface is optionally purged to remove unreacted molybdenum precursor, reaction products, and by-products. Purging the processing chamber in operation 156 can be the same process or different process than the purge described in other embodiments. Purging the processing chamber, portion of the processing chamber, area adjacent the substrate surface, etc., removes unreacted reactant, reaction products and by-products from the area adjacent the substrate surface.

At operation 158, the substrate (or substrate surface) is exposed to a silane reactant to form a molybdenum silicide film on the substrate. In some embodiments, the molybdenum silicide film is a nucleation film. The silane reactant may comprise any suitable silane reactant known to the skilled artisan. In some embodiments, the silane reactant is selected from the group consisting of silane, disilane, trisilane, tetrasilane, higher order silanes, and substituted silanes. The silane reactant can react with the molybdenum-containing species on the substrate surface to form the molybdenum silicide film. Exposure to the reactant at operation 158 can occur at any suitable temperature, pressure, and exposure duration known to the skilled artisan. In some embodiments, the substrate (or substrate surface) is exposed to the silane reactant at a pressure in a range of from 10 Torr to 50 Torr and at a temperature in a range of from 400° C. to 550° C.

At operation 160, the processing chamber is optionally purged after exposure to the reactant. Purging the processing chamber in operation 160 can be the same process or different process than the purge described in other embodiments. Purging the processing chamber, portion of the processing chamber, area adjacent the substrate surface, etc., removes unreacted silane reactant, reaction products and by-products from the area adjacent the substrate surface.

At operation 162, the substrate is soaked in a solution of titanium precursor. In some embodiments, the titanium precursor may comprise a titanium halide selected from one or more of titanium chloride ($TiCl_4$), titanium fluoride ($TiF_4$), titanium iodide ($TiI_4$), and titanium bromide ($TiBr_4$).

In specific embodiments, the titanium precursor comprises titanium chloride ($TiCl_4$). In some embodiments, the substrate may be soaked in the titanium precursor for a time period in a range of from greater than 0 seconds to 60 seconds. In some embodiments, the substrate may be soaked in the titanium precursor at a pressure in a range of from 3 Torr to 50 Torr and at a temperature in a range of from 300° C. to 600° C. or from 400° C. to 550° C.

At operation 164, the substrate surface or the processing chamber may be optionally purged of the titanium chloride. The purging may be the same or different from the purging described in other embodiments.

At decision 166, the thickness of the deposited film, or number of cycles of molybdenum-precursor, silane reactant, and soaking in titanium precursor is considered. If the deposited film has reached a predetermined thickness or a predetermined number of process cycles have been performed, the method 150 moves to operation 168. If the thickness of the deposited film or the number of process cycles has not reached the predetermined threshold, the method 150 returns to deposition 152 to expose the substrate surface to the molybdenum precursor again in operation 154 and continuing.

If the deposited film has reached a predetermined thickness or a predetermined number of process cycles have been performed, the method 150 moves to operation 168 with a bulk molybdenum gap fill. The bulk molybdenum gap fill operation 168 may comprise any suitable gap fill process known to one of skill in the art. In some embodiments, the gap fill process may be a bottom-up gap fill. In other embodiments, the gap fill process made be a traditional gap fill process.

In one or more embodiments, after the gap fill process, the substrate is annealed at operation 170. The annealing may comprise any suitable annealing process known to one of skill in the art. In one or more embodiments, annealing is conducted at a temperature in a range of from 600° C. to 1200° C. in an atmosphere of nitrogen ($N_2$), helium (He), argon (Ar), or hydrogen ($H_2$) gas.

Figure 4:
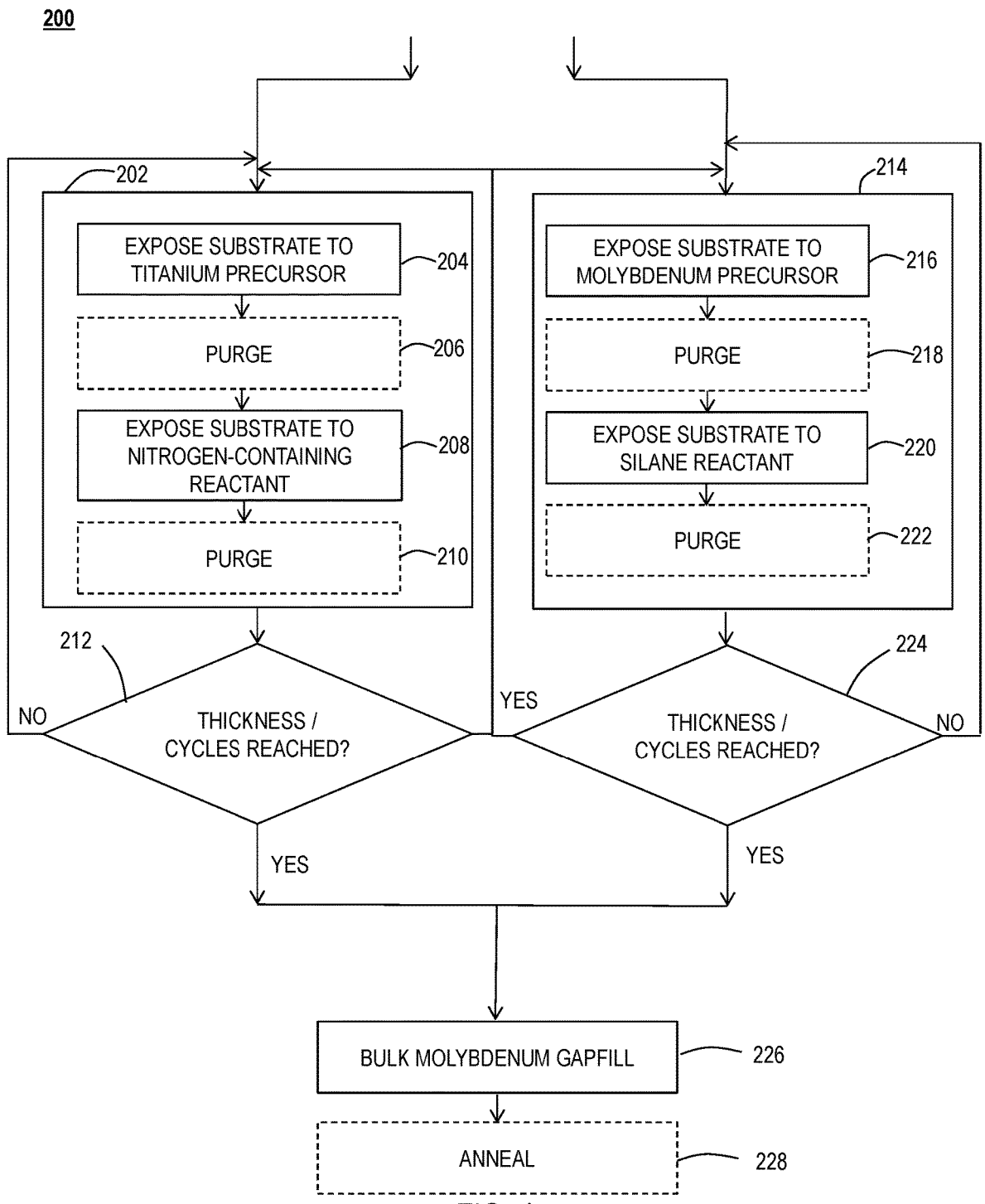
FIG. 4 illustrates a process flow diagram of a method according to one or more embodiments.

FIG. 4 illustrates a process flow diagram of a method according to one or more embodiments. In the embodiments illustrated in FIG. 4, the substrate may be processed with two atomic layer deposition cycles. In some embodiments, the substrate may be processed with a first deposition cycle 202 followed by a second deposition cycle 214. In other embodiments, the substrate may be processed with the second deposition cycle 214 followed by the first deposition cycle 202. In still further embodiments, the substrate may be processed with a super deposition cycle that comprises the first deposition cycle 202 and the second deposition cycle 214.

The first deposition cycle 202 is representative of an atomic layer deposition (ALD) process, where a process is performed to deposit a titanium-containing film on the substrate (or substrate surface). The deposition process can include one or more operations to form a film on the substrate. In operation 204, the substrate (or substrate surface) is exposed to a titanium precursor to form a titanium species on the substrate (or substrate surface). The titanium precursor may comprise any suitable precursor known to the skilled artisan. In some embodiments, the titanium precursor may comprise one or more of titanium chloride ($TiCl_4$), titanium fluoride ($TiF_4$), titanium iodide ($TiI_4$), titanium bromide ($TiBr_4$), and tetrakis(dimethylamino)titanium (TD-MAT). In specific embodiments, the titanium precursor comprises titanium chloride ($TiCl_4$). In some embodiments, the substrate is exposed to the titanium precursor at a temperature in a range of from 200° C. to 600° C. or from 200° C. to 550° C.

At operation 206, the processing chamber or substrate surface is optionally purged to remove unreacted titanium precursor, reaction products, and by-products. Purging the processing chamber in operation 206 can be the same process or different process than the purge described in other embodiments. Purging the processing chamber, portion of the processing chamber, area adjacent the substrate surface, etc., removes unreacted reactant, reaction products and by-products from the area adjacent the substrate surface.

At operation 208, the substrate (or substrate surface) is exposed to a nitrogen-containing reactant to form a titanium nitride film on the substrate. The nitrogen containing reactant can be any suitable nitrogen containing reactant known to the skilled artisan. In one or more embodiments, the nitrogen containing reactant is selected from one or more of ammonia ($NH_3$) or hydrazine ($N_2H_4$).

At operation 210, the processing chamber or substrate surface is optionally purged to remove unreacted nitrogen-containing reactant, reaction products, and by-products. Purging the processing chamber in operation 210 can be the same process or different process than the purge described in other embodiments. Purging the processing chamber, portion of the processing chamber, area adjacent the substrate surface, etc., removes unreacted reactant, reaction products and by-products from the area adjacent the substrate surface.

At decision 212, the thickness of the deposited titanium nitride film, or number of cycles of titanium precursor and nitrogen-containing reactant is considered. If the deposited film has reached a predetermined thickness or a predetermined number of process cycles have been performed, the method 200 moves to operation 226. If the thickness of the deposited film or the number of process cycles has not reached the predetermined threshold, the method 200 returns to deposition 202 to expose the substrate surface to the titanium precursor again in operation 204 and continuing.

In some embodiments, at decision 212, the method 200 moves to second deposition cycle 214.

The second deposition cycle 214 is representative of an atomic layer deposition (ALD) process, where a process is performed to deposit a molybdenum-containing film on the substrate (or substrate surface). The deposition process can include one or more operations to form a film on the substrate. In operation 216, the substrate (or substrate surface) is exposed to a molybdenum precursor to deposit a film on the substrate (or substrate surface). The molybdenum precursor can be any suitable molybdenum-containing compound that can react with (i.e., adsorb or chemisorb onto) the substrate surface to leave a molybdenum-containing species on the substrate surface. In one or more embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), Tetrakis(dimethylamino)molybdenum (IV), and Bis(tert-butylimido)-bis(dimethylamido) molybdenum. In some embodiments, the substrate (or substrate surface) is exposed to a molybdenum precursor at a pressure in a range of from 10 Torr to 50 Torr and at a temperature in a range of from 400° C. to 550° C.

At operation 218, the processing chamber or substrate surface is optionally purged to remove unreacted molybdenum precursor, reaction products, and by-products. Purging the processing chamber in operation 218 can be the same process or different process than the purge described in other embodiments. Purging the processing chamber, portion of the processing chamber, area adjacent the substrate surface, etc., removes unreacted reactant, reaction products and by-products from the area adjacent the substrate surface.

At operation 220, the substrate (or substrate surface) is exposed to a silane reactant to form a molybdenum silicide film on the substrate. In some embodiments, the molybdenum silicide film is a nucleation film. The silane reactant may comprise any suitable silane reactant known to the skilled artisan. In some embodiments, the silane reactant is selected from the group consisting of silane, disilane, trisilane, tetrasilane, higher order silanes, and substituted silanes. The silane reactant can react with the molybdenum-containing species on the substrate surface to form the molybdenum silicide film. Exposure to the silane reactant at operation 220 can occur at any suitable temperature, pressure, and exposure duration known to the skilled artisan. In some embodiments, the substrate (or substrate surface) is exposed to the silane reactant at a pressure in a range of from 10 Torr to 50 Torr and at a temperature in a range of from 400° C. to 550° C.

At operation 222, the processing chamber is optionally purged after exposure to the silane reactant. Purging the processing chamber in operation 222 can be the same process or different process than the purge described in other embodiments. Purging the processing chamber, portion of the processing chamber, area adjacent the substrate surface, etc., removes unreacted silane reactant, reaction products, and by-products from the area adjacent the substrate surface.

At decision 224, the thickness of the deposited film, or number of cycles of molybdenum-precursor and silane reactant is considered. If the deposited film has reached a predetermined thickness or a predetermined number of process cycles have been performed, the method 200 moves to operation 226. If the thickness of the deposited film or the number of process cycles has not reached the predetermined threshold, the method 200 returns to deposition 214 to expose the substrate surface to the molybdenum precursor again in operation 216 and continuing.

In embodiments where the second deposition cycle 214 is performed first, at decision 224, the method 200 may move to the first deposition cycle 202.

In one or more embodiments, after the desired thickness of titanium nitride film and molybdenum silicide film has been obtained, the method 200 moves to operation 226 with a bulk molybdenum gap fill. The bulk molybdenum gap fill operation 226 may comprise any suitable gap fill process known to one of skill in the art. In some embodiments, the gap fill process comprises exposing the substrate to a molybdenum precursor and a reactant, e.g., hydrogen ($H_2$), to a form bulk molybdenum film. The molybdenum precursor can be any suitable molybdenum-containing compound that can react with (i.e., adsorb or chemisorb onto) the substrate surface to leave a molybdenum-containing species on the substrate surface. In one or more embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), Tetrakis(dimethylamino)molybdenum (IV), and Bis(tert-butylimido)-bis(dimethylamido) molybdenum. In some embodiments, the substrate (or substrate surface) is exposed to a molybdenum precursor at a pressure in a range of from 10 Torr to 50 Torr and at a temperature in a range of from 400° C. to 550° C.

In one or more embodiments, after the gap fill process, the substrate is annealed at operation 228. The annealing may comprise any suitable annealing process known to one of skill in the art. In one or more embodiments, annealing is conducted at a temperature in a range of from 600° C. to 1200° C. in an atmosphere of nitrogen ($N_2$), helium (He), argon (Ar), or hydrogen ($H_2$) gas.

Figure 5:
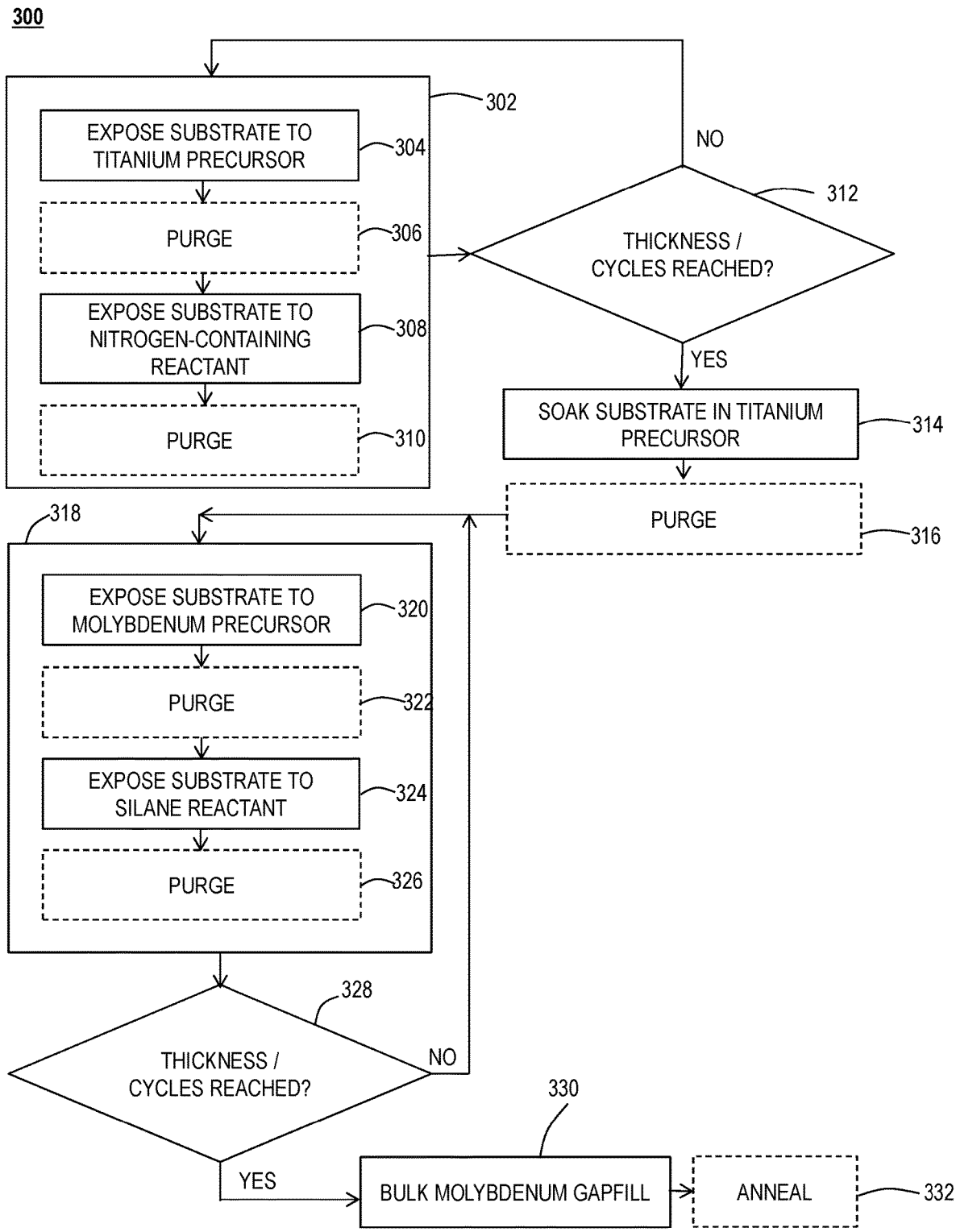
FIG. 5 illustrates a process flow diagram of a method according to one or more embodiments.

FIG. 5 illustrates a process flow diagram of a method 300 according to one or more embodiments. In the embodiments illustrated in FIG. 5, the substrate may be processed with two atomic layer deposition cycles. In some embodiments, the substrate may be processed with a first deposition cycle 302 followed by a second deposition cycle 318.

The first deposition cycle 302 is representative of an atomic layer deposition (ALD) process, where a process is performed to deposit a titanium-containing film on the substrate (or substrate surface). The deposition process can include one or more operations to form a film on the substrate. In operation 304, the substrate (or substrate surface) is exposed to a titanium precursor to form a titanium species on the substrate (or substrate surface). The titanium precursor may comprise any suitable precursor known to the skilled artisan. In some embodiments, the titanium precursor may comprise one or more of titanium chloride ($TiCl_4$), titanium fluoride ($TiF_4$), titanium iodide ($TiI_4$), titanium bromide ($TiBr_4$), and tetrakis(dimethylamino)titanium (TDMAT). In specific embodiments, the titanium precursor comprises titanium chloride ($TiCl_4$). In some embodiments, the substrate is exposed to the titanium precursor at a temperature in a range of from 200° C. to 600° C. or from 200° C. to 550° C.

At operation 306, the processing chamber or substrate surface is optionally purged to remove unreacted titanium chloride, reaction products and by-products. Purging the processing chamber in operation 306 can be the same process or different process than the purge described in other embodiments. Purging the processing chamber, portion of the processing chamber, area adjacent the substrate surface, etc., removes unreacted reactant, reaction products and by-products from the area adjacent the substrate surface.

At operation 308, the substrate (or substrate surface) is exposed to a nitrogen-containing reactant to form a titanium nitride film on the substrate. The nitrogen containing reactant can be any suitable nitrogen containing reactant known to the skilled artisan. In one or more embodiments, the nitrogen containing reactant is selected from one or more of ammonia ($NH_3$) or hydrazine ($N_2H_4$).

At operation 310, the processing chamber or substrate surface is optionally purged to remove unreacted nitrogen-containing reactant, reaction products, and by-products. Purging the processing chamber in operation 210 can be the same process or different process than the purge described in other embodiments. Purging the processing chamber, portion of the processing chamber, area adjacent the substrate surface, etc., removes unreacted reactant, reaction products and by-products from the area adjacent the substrate surface.

At decision 312, the thickness of the deposited titanium nitride film, or number of cycles of titanium precursor and nitrogen-containing reactant is considered. If the deposited film has reached a predetermined thickness or a predetermined number of process cycles have been performed, the method 300 moves to operation 314. If the thickness of the deposited film or the number of process cycles has not reached the predetermined threshold, the method 300 returns to deposition 302 to expose the substrate surface to the titanium precursor again in operation 304 and continuing.

At operation 314, the substrate having a titanium nitride film thereon is soaked in a solution of titanium precursor, e.g., titanium chloride ($TiCl_4$). The titanium precursor may comprise any suitable titanium precursor known to the skilled artisan. In some embodiments, the titanium precursor may comprise a titanium halide selected from one or more of titanium chloride ($TiCl_4$), titanium fluoride ($TiF_4$), titanium iodide ($TiI_4$), and titanium bromide ($TiBr_4$). In specific embodiments, the titanium precursor comprises titanium chloride ($TiCl_4$). In some embodiments, the substrate may be soaked in the titanium precursor for a time period in a range of from greater than 0 seconds to 60 seconds. In some embodiments, the substrate may be soaked in the titanium precursor at a pressure in a range of from 3 Torr to 50 Torr and at a temperature in a range of from 300° C. to 600° C. or from 400° C. to 550° C.

At operation 316, the substrate surface or the processing chamber may be optionally purged of the titanium precursor. The purging may be the same or different from the purging described in other embodiments.

In one or more embodiments, after soaking in the titanium precursor at operation 314, the method 300 moves to second deposition cycle 218.

The second deposition cycle 318 is representative of an atomic layer deposition (ALD) process, where a process is performed to deposit a molybdenum-containing film on the substrate (or substrate surface). The deposition process can include one or more operations to form a film on the substrate. In operation 320, the substrate (or substrate surface) is exposed to a molybdenum precursor to deposit a film on the substrate (or substrate surface). The molybdenum precursor can be any suitable molybdenum-containing compound that can react with (i.e., adsorb or chemisorb onto) the substrate surface to leave a molybdenum-containing species on the substrate surface. In one or more embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), Tetrakis(dimethylamino)molybdenum (IV), and Bis(tert-butylimido)-bis(dimethylamido) molybdenum. In some embodiments, the substrate (or substrate surface) is exposed to a molybdenum precursor at a pressure in a range of from 10 Torr to 50 Torr and at a temperature in a range of from 400° C. to 550° C.

At operation 322, the processing chamber or substrate surface is optionally purged to remove unreacted molybdenum precursor, reaction products, and by-products. Purging the processing chamber in operation 322 can be the same process or different process than the purge described in other embodiments. Purging the processing chamber, portion of the processing chamber, area adjacent the substrate surface, etc., removes unreacted reactant, reaction products and by-products from the area adjacent the substrate surface.

At operation 324, the substrate (or substrate surface) is exposed to a silane reactant to form a molybdenum silicide film on the substrate. In some embodiments, the molybdenum silicide film is a nucleation film. The silane reactant may comprise any suitable silane reactant known to the skilled artisan. In some embodiments, the silane reactant is selected from the group consisting of silane, disilane, trisilane, tetrasilane, higher order silanes, and substituted silanes. The silane reactant can react with the molybdenum-containing species on the substrate surface to form the molybdenum silicide film. Exposure to the silane reactant at operation 324 can occur at any suitable temperature, pressure, and exposure duration known to the skilled artisan. In some embodiments, the substrate (or substrate surface) is exposed to the silane reactant at a pressure in a range of from 10 Torr to 50 Torr and at a temperature in a range of from 400° C. to 550° C.

At operation 326, the processing chamber is optionally purged after exposure to the silane reactant. Purging the processing chamber in operation 326 can be the same process or different process than the purge described in other embodiments. Purging the processing chamber, portion of the processing chamber, area adjacent the substrate surface, etc., removes unreacted silane reactant, reaction products, and by-products from the area adjacent the substrate surface.

At decision 328, the thickness of the deposited film, or number of cycles of molybdenum-precursor and silane reactant is considered. If the deposited film has reached a predetermined thickness or a predetermined number of process cycles have been performed, the method 300 moves to operation 330. If the thickness of the deposited film or the number of process cycles has not reached the predetermined threshold, the method 300 returns to deposition 318 to expose the substrate surface to the molybdenum precursor again in operation 320 and continuing.

In one or more embodiments, after the desired thickness/number of cycles of titanium nitride film, titanium precursor soak, and molybdenum silicide film has been obtained, the method 300 moves to operation 330 with a bulk molybdenum gap fill. In operation 330, the substrate (or substrate surface) is exposed to a molybdenum precursor, e.g., molybdenum dichloride dioxide ($MoO_2Cl_2$), followed by exposure to a reactant, hydrogen ($H_2$), to deposit a film on the substrate (or substrate surface). The molybdenum precursor can be any suitable molybdenum-containing compound that can react with (i.e., adsorb or chemisorb onto) the substrate surface to leave a molybdenum-containing species on the substrate surface. In one or more embodiments, the molybdenum precursor comprises one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), Tetrakis(dimethylamino)molybdenum(IV), and Bis(tert-butylimido)-bis(dimethylamido)molybdenum. The bulk molybdenum gap fill operation 330 may comprise any suitable gap fill process known to one of skill in the art. In some embodiments, the gap fill process may be a bottom-up gap fill. In other embodiments, the gap fill process made be a traditional gap fill process.

In one or more embodiments, after the gap fill process, the substrate is annealed at operation 332. The annealing may comprise any suitable annealing process known to one of skill in the art. In one or more embodiments, annealing is conducted at a temperature in a range of from 600° C. to 1200° C. in an atmosphere of nitrogen ($N_2$), helium (He), argon (Ar), or hydrogen ($H_2$) gas.

FIGS. 6 through 11 are cross-sectional views illustrating a memory device 600 in various stages of processing to form a buried word line (bWL) according to one or more embodiments.

Figure 6:
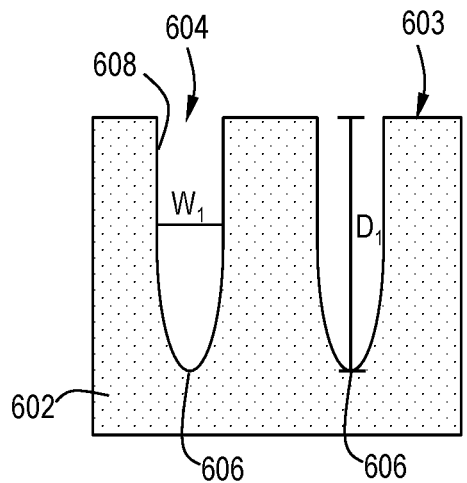
FIG. 6 is a cross-section view of a device according to one or more embodiments.

Referring to FIG. 6, a substrate 602 is provided having a plurality of trenches 604 therein. The trenches 604 form a recessed channel. The trenches have a bottom 606 and at least one sidewall 608. The plurality of trenches 604 may be formed so as to have a width within a range of about 10 to about 100 nm, including, but not limited to a range of about 10 nm to about 80 nm, about 10 nm to about 70 nm, about 10 nm to about 60 nm, about 10 nm to about 50 nm, or about 10 nm to about 40 nm. As will be recognized by one of skill in the art, the width of the plurality of trenches 604 is defined by a distance Wi from one sidewall 608 to another sidewall 608. The plurality of trenches 604 may be formed so as to have a depth within a range of about 120 nm to about 250 nm, including, but not limited to a range of about 120 nm to about 150 nm, about 150 nm to about 200 nm, about 200 nm to about 250 nm, about 120 nm to about 200 nm, or about 150 nm to about 250 nm. As will be recognized by one of skill in the art, the depth of the plurality of trenches 604 is defined by the distance $D_1$ from the substrate surface 603 to the bottom 606 of the plurality of trenches 604.

In order to form the plurality of trenches 604, a buffer insulating layer (e.g., a silicon oxide layer, not illustrated) may be formed on the substrate surface 603, and/or a hard mask layer (e.g., a nitride layer, not illustrated) may be formed. Such techniques are well known to those skilled and the art, and, thus, are not illustrated.

Figure 7:
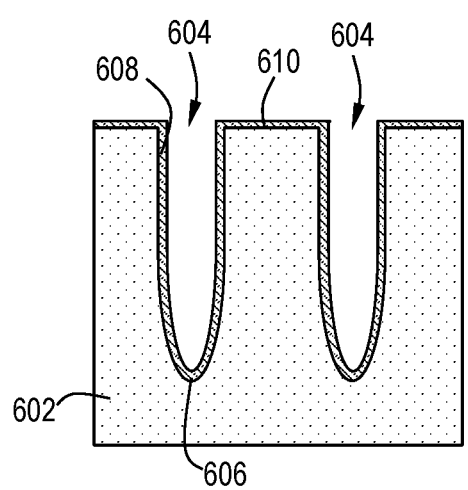
FIG. 7 is a cross-section view of a device according to one or more embodiments.

With reference to FIG. 7, a gate oxide layer 610 is conformally deposited on the substrate 602, on the substrate surface 603 and along the sidewall(s) 608 and bottom 606 of the plurality of trenches 604. In one or more embodiments, the gate oxide layer 610 comprises one or more of silicon oxynitride (SiON), silicon oxide, or a high-K dielectric material.

While the term "silicon oxide" may be used to describe the gate oxide layer 610, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g., silicon nitride, silicon oxynitride, tungsten oxide, zirconium oxide, aluminum oxide, hafnium oxide, and the like.

In one or more embodiments, the term "high-K dielectric" refers to a material with a high dielectric constant (as compared to, e.g., silicon dioxide). In one or more embodiments, the high-K dielectric material is selected from one or more of hafnium oxide ($HfO_2$), zirconium oxide ($ZrO_2$), vanadium oxide ($VO_2$), titanium oxide ($TiO_2$), tin oxide ($SnO_2$), aluminum oxide ($Al_2O_3$), zinc oxide (ZnO), hafnium silicon oxide (HfSiO), or zirconium silicon oxide (ZrSiO).

In one or more embodiments, the gate oxide layer 610 has a thickness in a range of about 1 nm to about 7 nm, including about 1 nm, about 2 nm, about 3 nm, about 4 nm, about 5 nm, about 6 nm, or about 7 nm.

Figure 8:
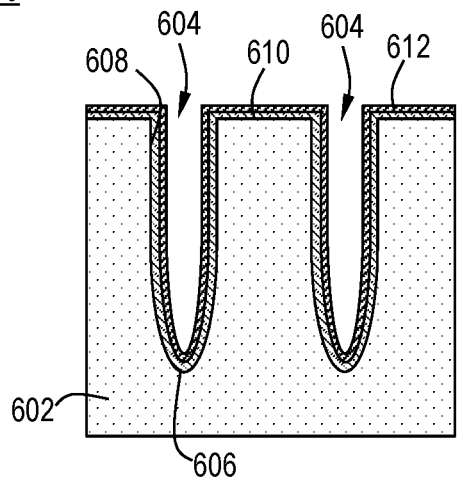
FIG. 8 is a cross-section view of a device according to one or more embodiments.

Referring to FIG. 8, in some embodiments, a work function metal layer 612 is formed on the gate oxide layer 610. As used herein, the term "work-function" refers to the bulk chemical potential of a material (e.g., metal) relative to the vacuum level. In one or more embodiments, the work-function metal layer has a work function greater than or equal to 4.3 eV. In some embodiments, the work-function metal layer 612 has a work function greater than or equal to 4.5 eV. In other embodiments, the work-function metal layer 612 has a work-function greater than or equal to 4.3 eV, including greater than or equal to 4.4 eV, greater than or equal to 4.5 eV, greater than or equal to 4.6 eV, greater than or equal to 4.7 eV, greater than or equal to 4.8 eV, greater than or equal to 4.9 eV, greater than or equal to 5.0 eV, greater than or equal to 5.1 eV, or greater than or equal to 5.2 eV.

In one or more embodiments, the work-function metal layer 612 comprises a metal nitride. In one or more embodiments, the work-function metal layer 612 comprises one or more of titanium nitride (TiN), tungsten nitride (WN), tantalum nitride (TaN), molybdenum nitride (MoN), TaN/TiN, or WN/TiN. In one or more embodiments, the work-function metal layer 612 is selected from the group consisting of titanium nitride (TiN), tungsten nitride (WN), tantalum nitride (TaN), molybdenum nitride (MoN), TaN/TiN, WN/TiN, and combinations thereof. In one or more embodiments, the work-function metal layer 612 comprises titanium nitride.

In one or more embodiments, the work-function metal layer 612 has a thickness in a range of about 1 nm to about 5 nm, including about 1 nm, about 2 nm, about 3 nm, about 4 nm, or about 5 nm.

Figure 9:
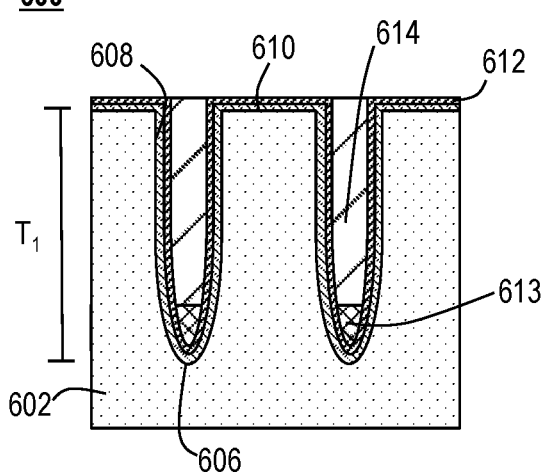
FIG. 9 is a cross-section view of a device according to one or more embodiments.

With reference to FIG. 9, a metal layer 614 is formed in the plurality of trenches 604 on the gate oxide layer 610. In one or more embodiments, the metal layer 614 is formed by depositing a molybdenum-containing nucleation layer 613 (e.g., molybdenum silicide) followed by bulk molybdenum gap fill, according to the methods of one or more embodiments, as illustrated in FIGS. 1 through 5.

Figure 10:
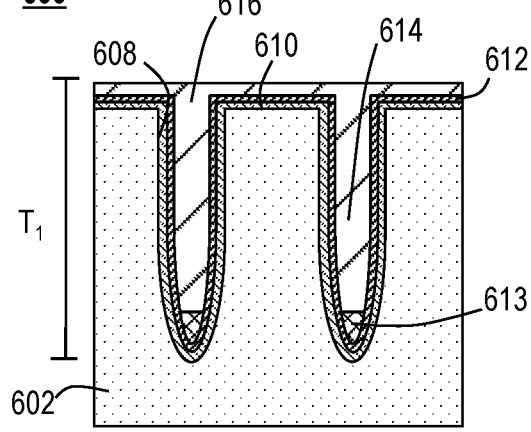
FIG. 10 is a cross-section view of a device according to one or more embodiments.

In some embodiments, the thickness $T_1$ of the metal layer 614 is controlled. In some embodiments, the thickness $T_1$ of the metal layer 614 is controlled relative to the depth $D_1$ of the plurality of trenches 604. In some embodiments, the thickness $T_1$ is greater than or equal to about 90% of the depth $D_1$ of the plurality of trenches 604. Referring to FIG. 10, in some embodiments, the thickness $T_1$ of the metal layer 614 is in excess of the depth D1 of the trench 604, an overburden of the metal layer 614 may be formed on the substrate.

In some embodiments, an anneal of the substrate is performed. Without intending to be bound by theory, it is believed that the formation of the nucleation layer 613 according to the method of one or more embodiments advantageously provides no line bending of the metal layer 614 in the plurality of trenches 604. Additionally, the formation of the nucleation layer 613 results in little to no delamination of the metal layer 614 upon annealing and results in substantially no voids being formed, particularly substantially no voids at the interface between the substrate and the metal layer 614. As used in this regard, a material which contains substantially no seam or voids has gaps, seams or voids which occupy less than 2%, less than 1% or less than 0.5% of the volume of the stated material.

Figure 11:
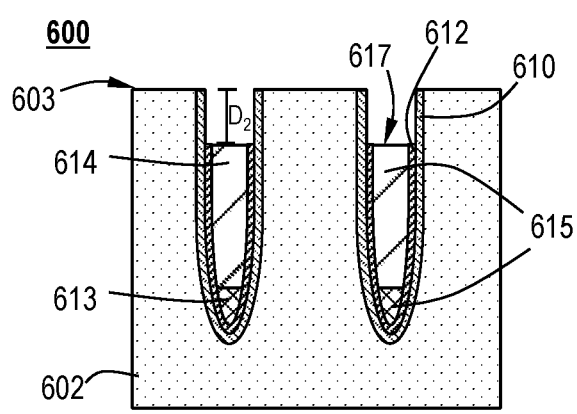
FIG. 11 is a cross-section view of a device according to one or more embodiments.

Referring to FIG. 11, in some embodiments, the metal layer 614 is recessed (buried) by chemical mechanical polishing (CMP) and an etch back such that the metal layer 614 and the work-function metal layer 612 do not protrude beyond the substrate surface 603 (e.g., so that the metal layer 614 is completely buried within the substrate 602).

In one or more embodiments, a buried word line 615 (i.e., the recessed metal layer 614) may be formed. In some embodiments, as illustrated in FIG. 11, the work-function metal layer 612 is recessed to the same level as the buried word line 615. A top surface 617 of the buried word line 615 and the work-function metal layer 612 is a recess depth or distance $D_2$ from the substrate surface 603 in the plurality of trenches 604.

After formation of the word line 615, processing of the substrate can continue to form a memory device. Such processes are known by the skilled artisan.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

A silicon substrate having a trench was placed in a processing chamber and soaked in a solution of titanium chloride ($TiCl_4$) for 600 seconds. The processing chamber was purged for 10 seconds. Molybdenum dichloride dioxide was flowed into the processing chamber in an atmosphere of nitrogen ($N_2$) gas over the soaked silicon substrate leaving a molybdenum-precursor terminated surface. Unreacted precursor and byproducts were then purged out of the chamber. Next, silane was introduced into the chamber and reacted with the surface-bound molybdenum species to form a molybdenum silicide film. Again, excess coreactant and byproducts were removed from the chamber by purging. The molybdenum dichloride dioxide and silane process cycle was completed twice. The trench was then gap filled with a bulk molybdenum film.

Example 2

A silicon substrate having a trench was placed in a processing chamber. Molybdenum dichloride dioxide was flowed into the processing chamber in an atmosphere of nitrogen ($N_2$) gas over the silicon substrate leaving a molybdenum-precursor terminated surface. Unreacted precursor and byproducts were then purged out of the chamber. Next, silane was introduced into the chamber and reacted with the surface-bound molybdenum species to form a molybdenum silicide film. Again, excess coreactant and byproducts were removed from the chamber by purging. The process cycle was repeated for two cycles. Then, the substrate was soaked in titanium chloride for 300 seconds. Excess titanium chloride was removed from the chamber by purging. The trench was then gap filled with a bulk molybdenum film.

Example 3

A silicon substrate having a trench was placed in a processing chamber. Molybdenum dichloride dioxide was flowed into the processing chamber in an atmosphere of nitrogen ($N_2$) gas over the silicon substrate leaving a molybdenum-precursor terminated surface. Unreacted precursor and byproducts were then purged out of the chamber. Next, silane was introduced into the chamber and reacted with the surface-bound molybdenum species to form a molybdenum silicide film. Again, excess coreactant and byproducts were removed from the chamber by purging. The substrate was then soaked in titanium chloride. Excess titanium chloride was removed from the chamber by purging. The super process cycle was repeated. The trench was then gap filled with a bulk molybdenum film.

Example 4

A silicon substrate having a trench was placed in a processing chamber. Titanium chloride was flowed into the processing chamber in an atmosphere of argon (Ar) gas over the silicon substrate. Unreacted titanium chloride was purged out of the chamber. Next, ammonia ($NH_3$) was introduced into the chamber and reacted with the titanium species on the substrate to form a titanium nitride film. Excess ammonia and byproducts were removed from the chamber by purging. Molybdenum dichloride dioxide was then flowed into the processing chamber in an atmosphere of nitrogen ($N_2$) gas over the silicon substrate with titanium nitride thereon, leaving a molybdenum-precursor terminated surface. Unreacted precursor and byproducts were then purged out of the chamber. Next, silane was introduced into the chamber and reacted with the surface-bound molybdenum species to form a molybdenum silicide film. Again, excess coreactant and byproducts were removed from the chamber by purging. The molybdenum and silane cycle was repeated two times. The trench was then gap filled with a bulk molybdenum film.

Example 5

A silicon substrate having a trench was placed in a processing chamber. Molybdenum dichloride dioxide was then flowed into the processing chamber in an atmosphere of nitrogen ($N_2$) gas over the silicon substrate with titanium nitride thereon, leaving a molybdenum-precursor terminated surface. Unreacted precursor and byproducts were then purged out of the chamber. Next, silane was introduced into the chamber and reacted with the surface-bound molybdenum species to form a molybdenum silicide film. Again, excess coreactant and byproducts were removed from the chamber by purging. The molybdenum and silane cycle was repeated two times. Titanium chloride was flowed into the processing chamber in an atmosphere of argon (Ar) gas over the substrate. Unreacted titanium chloride was purged out of the chamber. Next, ammonia ($NH_3$) was introduced into the chamber and reacted with the titanium species on the substrate to form a titanium nitride film. Excess ammonia and byproducts were removed from the chamber by purging. The trench was then gap filled with a bulk molybdenum film.

Example 6

A silicon substrate having a trench was placed in a processing chamber. Molybdenum dichloride dioxide was then flowed into the processing chamber in an atmosphere of nitrogen ($N_2$) gas over the silicon substrate with titanium nitride thereon, leaving a molybdenum-precursor terminated surface. Unreacted precursor and byproducts were then purged out of the chamber. Next, silane was introduced into the chamber and reacted with the surface-bound molybdenum species to form a molybdenum silicide film. Again, excess coreactant and byproducts were removed from the chamber by purging. Titanium chloride was flowed into the processing chamber in an atmosphere of argon (Ar) gas over the substrate. Unreacted titanium chloride was purged out of the chamber. Next, ammonia ($NH_3$) was introduced into the chamber and reacted with the titanium species on the substrate to form a titanium nitride film. Excess ammonia and byproducts were removed from the chamber by purging. The super cycle was repeated. The trench was then gap filled with a bulk molybdenum film.

Example 7

A silicon substrate having a trench was placed in a processing chamber. Titanium chloride was flowed into the processing chamber in an atmosphere of argon (Ar) gas over the silicon substrate. Unreacted titanium chloride was purged out of the chamber. Next, ammonia ($NH_3$) was introduced into the chamber and reacted with the titanium species on the substrate to form a titanium nitride film. Excess ammonia and byproducts were removed from the chamber by purging. The substrate was then soaked in titanium chloride for 10 seconds. The titanium chloride was purged from the reaction chamber. Molybdenum dichloride dioxide was then flowed into the processing chamber in an atmosphere of nitrogen ($N_2$) gas over the substrate, leaving a molybdenum-precursor terminated surface. Unreacted precursor and byproducts were then purged out of the chamber. Next, silane was introduced into the chamber and reacted with the surface-bound molybdenum species to form a molybdenum silicide film. Again, excess coreactant and byproducts were removed from the chamber by purging. The molybdenum and silane cycle was repeated two times. The trench was then gap filled with a bulk molybdenum film.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a film, the method comprising:
    forming a molybdenum-silicide film in a first process cycle comprising sequential exposure of a substrate to a molybdenum precursor, purge gas, a silane precursor, and purge gas, the substrate comprising a plurality of trenches with a gate oxide layer conformally deposited thereon and the molybdenum-silicide film formed in a bottom of the plurality of trenches on the gate oxide layer, the molybdenum precursor comprising one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$), Tetrakis(dimethylamino)molybdenum(IV), and Bis(tert-butylimido)-bis(dimethylamido)molybdenum; and
    forming a soaked substrate having a titanium species thereon without forming a titanium nitride film in a second process cycle, the second process cycle consisting of flowing a titanium precursor in an atmosphere of argon (Ar) gas over the substrate, and purging the soaked substrate of unreacted titanium precursor, wherein the soaked substrate is formed prior to the first process cycle or wherein the soaked substrate is formed after the first process cycle.

2. The method of claim 1, wherein purging comprises one or more of applying a vacuum or flowing a purge gas over the substrate.

3. The method of claim 1, further comprising exposing the substrate to a second molybdenum precursor and a reactant to fill the plurality of trenches with a bulk molybdenum film.

4. The method of claim 3, further comprising annealing the substrate, wherein the bulk molybdenum film has line bending of less than 2 nm, there is no delamination of the bulk molybdenum film, and the bulk molybdenum film does not have voids.

5. A method of forming a film, the method comprising:
    forming a titanium nitride film in a first process cycle, the first process cycle comprising exposing a substrate to a first titanium precursor and exposing the substrate to a nitrogen-containing reactant, the substrate comprising a plurality of trenches with a gate oxide layer conformally deposited thereon;
    forming a soaked substrate having a titanium species thereon without forming a titanium nitride film in a second processing cycle, the second processing cycle consisting of flowing a first titanium precursor in an atmosphere of argon (Ar) gas over the substrate, and purging the soaked substrate of unreacted first titanium precursor; and
    forming a molybdenum-silicide film in a third process cycle comprising sequential exposure of a substrate to a molybdenum precursor, purge gas, a silane reactant, and purge gas, the molybdenum-silicide film formed in a bottom of the plurality of trenches on the gate oxide layer, the molybdenum precursor comprising one or more of molybdenum chloride ($MoCl_5$), molybdenum fluoride ($MoF_6$), molybdenum iodide ($MoI_6$), molybdenum bromide ($MoBr_3$), molybdenum hexacarbonyl ($Mo(CO)_6$), molybdenum dichloride dioxide ($MoO_2Cl_2$), molybdenum oxytetrachloride ($MoOCl_4$) Tetrakis(dimethylamino)molybdenum(IV), and Bis (tert-butylimido)-bis(dimethylamido)molybdenum, wherein the first process cycle is performed first, followed by the second process cycle, then the third process cycle.

6. The method of claim 5, further comprising repeating the method to fill the plurality of trenches.

7. The method of claim 6, further comprising annealing the substrate, wherein the molybdenum-silicide film does not have voids.

8. A method of forming a memory device, the method comprising:
   conformally depositing a gate oxide layer on a substrate having a plurality of trenches therein, each trench having a surface, at least one sidewall, and a bottom, the gate oxide layer forming on the surface, along the at least one sidewall, and on the bottom of the trench;
   forming a work function metal layer comprising titanium nitride on the gate oxide layer by exposing the substrate to a first titanium precursor and a nitrogen-containing reactant to form the work function metal layer;
   forming a soaked substrate having a titanium species thereon without forming a titanium nitride layer in a process cycle, the process cycle consisting of flowing a second titanium precursor in an atmosphere of argon (Ar) gas over the substrate, and purging the soaked substrate of unreacted second titanium precursor, wherein the soaked substrate is formed after forming the work function metal layer;
   exposing the substrate to a first molybdenum precursor and a silane reactant to form a molybdenum silicide nucleation layer on the soaked substrate;
   exposing the substrate to a second molybdenum precursor and a reactant to fill the plurality of trenches with a bulk molybdenum film;
   annealing the substrate, wherein the bulk molybdenum film has line bending of less than 2 nm, there is no delamination of the bulk molybdenum film, and the bulk molybdenum film does not have voids; and
   recessing the annealed bulk molybdenum film to form a buried word line.

9. The method of claim 8, wherein the substrate is exposed to the first molybdenum precursor and the silane reactant sequentially.

10. The method of claim 8, wherein the substrate is exposed to the first molybdenum precursor and the silane reactant simultaneously.

11. The method of claim 8, further comprising purging the surface of the substrate of the second titanium precursor prior to exposing the substrate to the first molybdenum precursor.

12. The method of claim 11, wherein purging comprises one or more of applying a vacuum or flowing a purge gas over the substrate.

13. The method of claim 12, wherein the purge gas comprises one or more of nitrogen ($N_2$), helium (He), and argon (Ar).

* * * * *

UNITED STATES PATENT AND TRADEMARK OFFICE
CERTIFICATE OF CORRECTION

PATENT NO. : 12,114,488 B2
APPLICATION NO. : 17/308577
DATED : October 8, 2024
INVENTOR(S) : Yong Yang et al.

Page 1 of 1

It is certified that error appears in the above-identified patent and that said Letters Patent is hereby corrected as shown below:

In the Specification

Column 17, Line 3, replace "Wi" after "by a distance" and before "from one sidewall" with "$W_1$".

Signed and Sealed this
Twenty-sixth Day of November, 2024

Katherine Kelly Vidal
*Director of the United States Patent and Trademark Office*